(12) United States Patent
Premerlani et al.

(10) Patent No.: US 10,168,372 B2
(45) Date of Patent: Jan. 1, 2019

(54) SYSTEM AND METHOD FOR LEAKAGE CURRENT AND FAULT LOCATION DETECTION IN ELECTRIC VEHICLE DC POWER CIRCUITS

(71) Applicant: General Electric Company, Schenectady, NY (US)

(72) Inventors: William James Premerlani, Scotia, NY (US); Ibrahima Ndiaye, Latham, NY (US); Kum-Kang Huh, Niskayuna, NY (US); Ahmed Elasser, Latham, NY (US)

(73) Assignee: General Electric Company, Schenectady, NY (US)

( * ) Notice: Subject to any disclaimer, the term of this patent is extended or adjusted under 35 U.S.C. 154(b) by 210 days.

(21) Appl. No.: 15/379,126

(22) Filed: Dec. 14, 2016

(65) Prior Publication Data

US 2018/0164361 A1    Jun. 14, 2018

(51) Int. Cl.
*G01R 31/00* (2006.01)
*B60L 11/18* (2006.01)
(Continued)

(52) U.S. Cl.
CPC ............ *G01R 31/007* (2013.01); *B60L 11/02* (2013.01); *B60L 11/1816* (2013.01);
(Continued)

(58) Field of Classification Search
CPC .. G01R 31/007; G01R 31/086; G01R 31/025; B60R 16/02; B60L 11/1816; B60L 11/02;
(Continued)

(56) References Cited

U.S. PATENT DOCUMENTS

| 5,508,872 A | 4/1996 | Khoo et al. |
| 6,346,805 B1 | 2/2002 | Ermisch et al. |

(Continued)

FOREIGN PATENT DOCUMENTS

| CN | 205185893 U | 4/2016 |
| JP | 2003-315374 A | 11/2003 |

(Continued)

OTHER PUBLICATIONS

Dattathreya et al., "Detection and Elimination of a Potential Fire in Engine and Battery Compartments of Hybrid Electric Vehicles," Advances in Fuzzy Systems—Special issue on Real-Life Applications of Fuzzy Logic, Jan. 2012, vol. 2012, 11 Pages.

(Continued)

*Primary Examiner* — Giovanni Astacio-Oquendo
(74) *Attorney, Agent, or Firm* — Ziolkowski Patent Solutions Group, SC; Jean K. Testa

(57) ABSTRACT

A system and method for leakage current detection and fault location identification in a DC power circuit is disclosed. The system includes a plurality of DC leakage current detectors positioned throughout the DC power circuit, the DC leakage current detectors configured to sense and locate a leakage current fault in the DC power circuit. Each of the DC leakage current detectors is configured to generate a net voltage at an output thereof indicative of whether a leakage current fault is present at a location at which the respective DC leakage current detector is positioned. A logic device in operable communication with the DC leakage current detectors receives output signals from each DC leakage current detector comprising the net voltage output and locates the leakage current fault in the DC power circuit based on the output signals received from the plurality of DC leakage current detectors.

20 Claims, 6 Drawing Sheets

(51) Int. Cl.
*B60L 11/02* (2006.01)
*G01R 31/02* (2006.01)
*G01R 31/08* (2006.01)
*B60R 16/02* (2006.01)

(52) U.S. Cl.
CPC ............ *B60R 16/02* (2013.01); *G01R 31/025* (2013.01); *G01R 31/086* (2013.01); *B60L 2210/12* (2013.01); *B60L 2210/14* (2013.01); *B60L 2270/00* (2013.01); *Y10S 903/903* (2013.01)

(58) Field of Classification Search
CPC ............ B60L 2270/00; B60L 2210/14; B60L 2210/12; Y10S 903/903
USPC .......................................... 324/503, 500, 509
See application file for complete search history.

(56) References Cited

U.S. PATENT DOCUMENTS

| | | |
|---|---|---|
| 6,388,451 B1 | 5/2002 | Burba et al. |
| 7,365,521 B2 | 4/2008 | Patterson |
| 7,583,483 B2 | 9/2009 | Trenchs et al. |
| 8,040,139 B2 | 10/2011 | Plagens et al. |
| 8,289,664 B2 | 10/2012 | Haines et al. |
| 8,421,466 B2 | 4/2013 | Kang et al. |
| 8,472,154 B2 | 6/2013 | Rivers, Jr. et al. |
| 9,046,580 B2 | 6/2015 | Hermann |
| 9,090,169 B2 | 7/2015 | Ang et al. |
| 9,244,110 B2 | 1/2016 | Ward |
| 9,274,158 B2 | 3/2016 | Tang et al. |
| 9,331,473 B2 | 5/2016 | Ward |
| 2004/0257732 A1 | 12/2004 | Yoshida et al. |
| 2005/0068820 A1* | 3/2005 | Radosevich .......... H02M 7/003 365/202 |
| 2012/0112702 A1* | 5/2012 | Steigerwald .......... B60L 3/0069 320/137 |
| 2012/0306264 A1 | 12/2012 | Komma et al. |
| 2018/0164362 A1* | 6/2018 | Premerlani ........ G01R 19/0092 |

FOREIGN PATENT DOCUMENTS

| | | |
|---|---|---|
| JP | 2012-105540 A | 5/2012 |
| JP | 2012-153197 A | 8/2012 |
| KR | 10-2014-0017783 A | 2/2014 |
| WO | 2013/111414 A1 | 8/2013 |
| WO | 2015/106975 A1 | 7/2015 |

OTHER PUBLICATIONS

Mulcahy et al., "Considerations on Ground Fault Protection for Electric Vehicles," White Paper, Feb. 2012, 12 Pages.

Brown, K., "Safety of Electric Vehicle Supply Equipment," IEEE Transportation Electrification Community, Retreived from the Internet URL: Https://tec.ieee.org/newsletter/october-2013/safety-of-electric-vehicle-supply-equipment, on Dec. 12, 2016, pp. 1-3 (Oct. 2013).

Jeong, Y.S., et al., "Fault Detection and Fault-Tolerant Control of interior permanent-magnet motor drive system for Electric Vehicle," 38th IAS Annual Meeting in Industry Applications Conference, vol. 3, pp. 1458-1463 (Oct. 12-16, 2003).

International Search Report and Written Opinion issued in connection with corresponding PCT Application No. PCT/US2017/62613 dated Mar. 6, 2018.

\* cited by examiner

SYSTEM AND METHOD FOR LEAKAGE CURRENT AND FAULT LOCATION DETECTION IN ELECTRIC VEHICLE DC POWER CIRCUITS

BACKGROUND OF THE INVENTION

The invention relates generally to a DC power circuit in hybrid and electric vehicles and, more particularly, to a system and method for leakage current detection and fault location identification in a DC power circuit in hybrid and electric vehicles.

Hybrid electric vehicles may combine an internal combustion engine and an electric motor powered by an energy storage device, such as a traction battery, to propel the vehicle. Such a combination may increase overall fuel efficiency by enabling the combustion engine and the electric motor to each operate in respective ranges of increased efficiency. Electric motors, for example, may be efficient at accelerating from a standing start, while combustion engines may be efficient during sustained periods of constant engine operation, such as in highway driving. Having an electric motor to boost initial acceleration allows combustion engines in hybrid electric vehicles to be smaller and more fuel efficient.

Purely electric vehicles use stored electrical energy to power an electric motor, which propels the vehicle and may also operate auxiliary drives. Purely electric vehicles may use one or more sources of stored electrical energy. For example, a first source of stored electrical energy may be used to provide longer-lasting energy while a second source of stored electrical energy may be used to provide higher-power energy for, for example, acceleration.

Plug-in electric vehicles, whether of the hybrid electric type or of the purely electric type, are configured to use electrical energy from an external source to recharge the traction battery. Such vehicles may include on-road and off-road vehicles, golf cars, neighborhood electric vehicles, forklifts, and utility trucks as examples. These vehicles may use either off-board stationary battery chargers or on-board battery chargers to transfer electrical energy from a utility grid or renewable energy source to the vehicle's on-board traction battery. Plug-in vehicles may include circuitry and connections to facilitate the recharging of the traction battery from the utility grid or other external source, for example. Additionally, an export power inverter may be provided that is able to invert power received from the DC bus of the vehicle and output an AC power that may be provided back to the utility grid or to another AC load that might require power.

The DC power circuit of the vehicle—i.e., the energy storage device(s), battery charger, export inverter and traction motor or other loads connected to a DC bus/network in the vehicle—are generally operated such that they are electrically isolated from the vehicle frame, such that a fault (short circuit) between one of the DC power conductors and the vehicle frame does not produce large fault currents. While such protection is provided due to the isolation of the DC power circuit from the vehicle frame, it is recognized that it is desirable to detect high impedance, low leakage current faults in the DC power circuit during operation of the vehicle, such that a protection strategy is provided to detect a fault and turn off power in the DC power circuit before a second fault develops. Furthermore, in the case that the fault is a leakage current through a person, it is desired to limit the amount of current needed to detect the fault to low levels.

An example of ground fault circuitry as known in the art for detecting leakage current to a vehicle frame as presented by TDI Power, Inc. is shown in FIG. 1, where a vehicle DC power circuit 2 is illustrated that includes ground fault detection circuitry 4 and associated resistors 6 that functions to detect leakage current to the vehicle frame that arises from a fault anywhere on the DC power bus 8. The ground fault detection circuitry 4 functions to detect a voltage change across the resistor(s) 6 that is indicative of a leakage current in the DC power circuit 2. The actual voltage during a fault depends on the ratio of the resistance of the fault leakage path to the resistance of the two biasing resistors 6. For the values of the resistors 6 shown in FIG. 1, the ratio of the resistance of the usual causes of leakage current to the biasing resistance is low enough to produce a significant change in voltage during a fault. During normal conditions, the resistors 6 establish a voltage of 95 volts across the 1 Megaohm resistor. During a fault from positive supply to ground, the voltage across the 1 Megaohm resistor can rise to as high as 380 volts. During a fault from negative supply to ground, the voltage can drop to as low as 0 volts. In the case of the circuit 2 in FIG. 1, the current through a fault from the positive side of the DC bus 8 to the vehicle frame is limited to +0.38 milliamps. For a fault from the negative side of the DC bus 8 to the vehicle frame, the fault current is limited to approximately −0.13 milliamps.

However, while the ground fault detection circuitry of FIG. 1 can detect leakage current to the vehicle frame that arises from a fault anywhere on the DC power bus, the ground fault detection circuitry does not give any indication concerning the location of the fault. That is, the voltage readings acquired/analyzed by the ground fault detection circuitry provides no information on the location of the fault within the vehicle DC power circuit, as the voltage readings are not dependent on the location of the fault. It is recognized that an indication of the location of the fault would be beneficial, in that such information would be useful for diagnostics and repair of the DC power circuit.

It would therefore be desirable to provide a system and method for leakage current detection and fault location identification in a DC power circuit in hybrid and electric vehicles. Such a system and method would identify the location of a fault in the DC power circuit, so as to provide for diagnostics and repair of the DC power circuit. The system and method could be employed in a stand-alone fashion without use of other known fault detection circuitry, or could also be used in combination with other known fault detection circuitry.

BRIEF DESCRIPTION OF THE INVENTION

According to one aspect of the invention, a system includes a DC power circuit having a DC bus comprising a pair of conductors, one or more energy storage devices connected to the DC bus to provide a DC power thereto, one or more power converters connected to the DC bus and configured to condition the DC power, and one or more loads positioned to receive power from the DC bus or the one of the respective one or more power converters. The system also includes a plurality of DC leakage current detectors positioned throughout the DC power circuit, the plurality of DC leakage current detector configured to sense and locate a leakage current fault in the DC power circuit, and wherein each of the plurality of DC leakage current detectors is configured to generate a net voltage at an output thereof indicative of whether a leakage current fault is present at a location at which the respective DC leakage current detector is positioned.

In accordance with another aspect of the invention, a method of sensing and locating a leakage current fault in a DC power circuit comprising a plurality of independent branches is disclosed. The method includes positioning a plurality of DC leakage current detectors throughout the DC power circuit on at least a portion of the independent branches. The method also includes generating, at each of the plurality of DC leakage current detectors, a net voltage output indicative of whether a leakage current fault is present at a location at which the respective DC leakage current detector is positioned and transmitting an output signal from each of the plurality of DC leakage current detectors to a logic device operably connected to the plurality of DC leakage current detectors, the output signal from each respective DC leakage current detector being representative of the net voltage output thereof. The method further includes analyzing, via the logic device, the output signals transmitted from the plurality of DC leakage current detectors to identify a location of a leakage current fault in the DC power circuit.

In accordance with yet another aspect of the invention, a vehicle includes a chassis and a DC power circuit electrically isolated from the chassis, the DC power circuit including a DC distribution bus comprising a plurality of independent branches and a plurality of system components electrically coupled to the DC distribution bus, the plurality of system components including one or more of each of energy storage devices, power converters, and vehicle loads. The vehicle also includes a plurality of DC leakage current detectors positioned throughout the DC power circuit on the plurality of independent branches, the plurality of DC leakage current detector configured to sense a leakage current fault in the DC power circuit. The vehicle further includes a logic device in operable communication with the plurality of DC leakage current detectors, the logic device being programmed to receive output signals from each of the plurality of DC leakage current detectors, the output signals comprising net voltage output data from each respective DC leakage current detector indicative of whether a leakage current fault is present at a location at which the respective DC leakage current detector is positioned. The logic device is further programmed to locate the leakage current fault in the DC power circuit based on the output signals received from the plurality of DC leakage current detectors.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Embodiments of the invention are directed to a system and method for leakage current detection and fault location identification in a DC power circuit in hybrid and electric vehicles. Ground fault detection circuitry is provided for the DC power circuit that includes a plurality of DC leakage current detectors positioned throughout the DC power circuit, with the DC leakage current detectors functioning to determine the path of any leakage current in the DC power circuit.

While embodiments of the invention are described below as part of a plug-in electric vehicle implantation/embodiment, it is recognized that embodiments of the invention may also be incorporated into hybrid plug-in electric vehicles, non-plug-in electric vehicles, and other general DC power circuits with numerous branches (other than in a vehicle environment) where it is desirable to be able to identify the location of a current fault in the circuit. Thus, it is recognized that embodiments of the invention are not meant to be limited to plug-in electric vehicles or electric/hybrid vehicles in general, and that embodiments of the invention may be utilized with/in other general DC power circuits with numerous branches.

Figure 1:
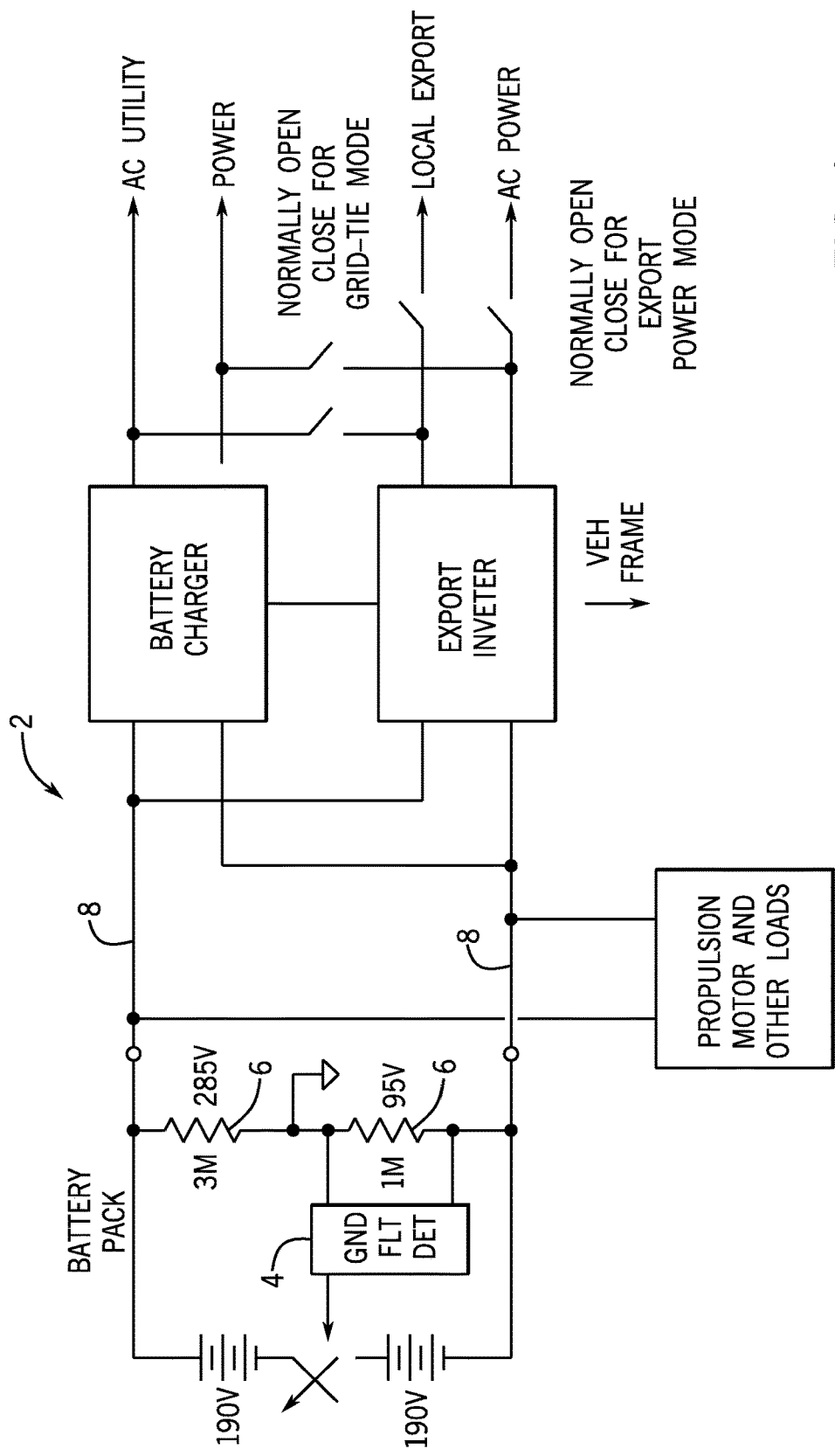
FIG. 1 is a schematic diagram of a DC power circuit in an electric vehicle and associated ground fault detection circuitry, as known in the prior art.
Figure 2:
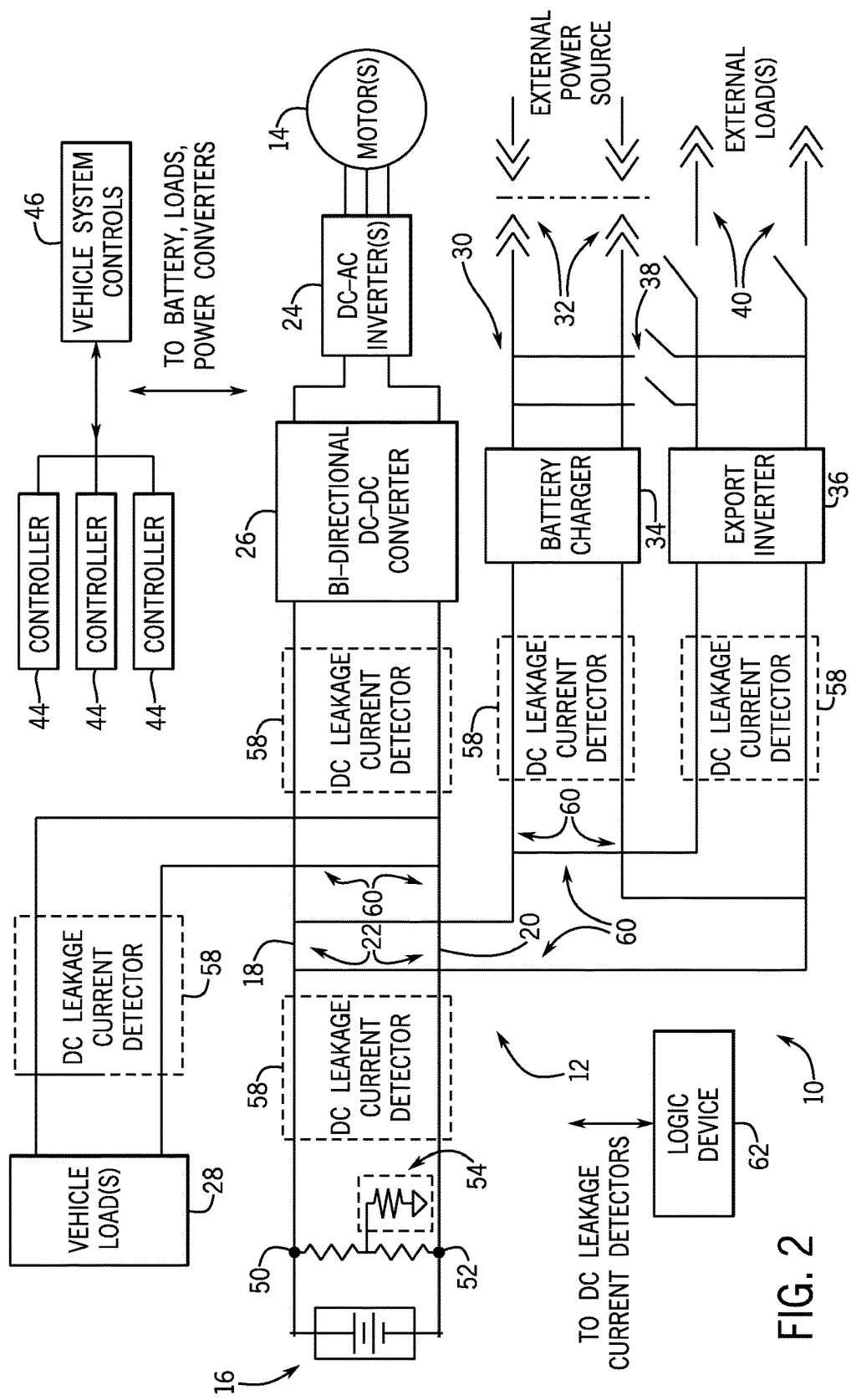
FIG. 2 is a schematic diagram of a DC power circuit in an electric vehicle with a plurality of DC leakage current detectors positioned throughout the circuit, according to an embodiment of the invention.

Referring to FIG. 2, a plug-in electric vehicle 10 is depicted with which and in which embodiments of the invention may be employed. The plug-in electric vehicle 10 includes a DC power circuit 12 that distributes power amongst one or more energy storage devices, loads, and power converters included in the circuit. A typical plug-in electric vehicle 10 includes, as part of DC power circuit 12, an electrical device or machine 14 capable of operating as a motor or a generator. In one embodiment, electrical machine 14 is a traction motor mechanically coupled to one or more driving wheels or axles (not shown) of the vehicle 10 to provide propulsion to the vehicle, when operating as a motor. During a regenerative braking of the vehicle 10, the electrical machine 14 acts as a generator by recovering energy that would normally be lost in the friction braking system.

As shown in FIG. 2, the DC power circuit 12 also includes a traction battery or battery pack 16 that stores energy that can be used by the electrical machine 14. In one embodiment, vehicle battery pack 16 provides a high voltage DC output onto a pair of conductors 18, 20 of a DC distribution bus 22 coupled thereto. One or more power converters 24, 26 may be connected to the DC distribution bus 22. The power converters 24, 26 condition and convert power from the distribution bus 22 into a form useable by the electrical machine 14 and/or other loads 28—with one or more of the power converters 24, 26 configured to provide the ability to bi-directionally transfer energy between the traction battery 16 and the electrical machine 14, for example. According to embodiments, the power converters 24, 26 include a bi-directional DC-to-AC voltage inverter 24 coupled to DC distribution bus 22 to invert a DC power on the DC bus to a three-phase AC power used by the electrical machine 14. In a regenerative mode where the electrical machine 14 acts as a generator, the DC-to-AC voltage inverter 24 may convert the three-phase AC current generated by the electrical machine 14 to the DC voltage compatible with the traction battery 16. The bi-directional DC-to-AC voltage inverter 24 may be of a known construction and include six half phase modules (not shown) that are paired to form three phases. The power converters 24, 26 may also include one or more DC-to-DC voltage converters 26 configured to convert one DC voltage into another DC voltage. Such DC-to-DC voltage converters 26 may be of a known construction and include an inductor coupled to a pair of switches and coupled to a pair of diodes (not shown), with the switches being controlled to buck or boost a voltage from the DC distribution bus 22 to a level suitable for use by another vehicle load 28 that receives power therefrom—such as a heating module or an air-conditioning module, for example.

When plug-in electric vehicle 10 is parked or not in use, it may be desirable to plug the vehicle into, for example, the utility grid or to a renewable energy source to refresh or recharge the battery pack 16. Accordingly, FIG. 2 shows the DC power circuit 12 of the vehicle 10 including a charging system 30 for the recharging of vehicle battery pack 16. Charging system 30 includes a charge port 32 that may be any type of port configured to receive a charge connector (e.g. power cord/plug) therein to transfer power from the external power source to the vehicle 10. The charge port 32 may be electrically connected to a charger or on-board power conversion module 34 (i.e., "battery charger") that conditions power supplied from the charge port 32 to provide the proper voltage and current levels to the traction battery 16, such as via rectification and/or DC-DC conversion of power received from the external power source. Power conditioned by the battery charger 34 is then provided to the DC distribution bus 22.

In one embodiment, an export power inverter 36 is also included in DC power circuit 12. The export inverter 36 may be provided that is able to invert power received from the DC distribution bus 22 of the vehicle and output an AC power that may be provided back to the utility grid or to another AC load that might require power. As shown in FIG. 2, a plurality of switches 38, 40, e.g., contactors, may be provided to selectively connect an output of the export inverter 36 to either the utility grid or to an external AC load. A first pair of contactors 38 is provided to selectively connect the output of the export inverter 36 to the utility grid and a second pair of contactors 40 is provided to selectively connect the output of the export inverter 36 to the external AC load. Each of the first and second pairs of contactors 38, 40 are normally in an open position but are selectively closed when it is desired to provide AC power from the export inverter 36 to one of the utility grid or the external AC load.

For operating and controlling the various components of the DC power circuit 12 described above, one or more associated controllers 44 is included in the plug-in electric vehicle 10 to control and monitor the operation of the components. The controller(s) 44 may communicate via a serial bus (e.g., Controller Area Network (CAN)) or via discrete conductors, and a system controller 46 may be present to coordinate the operation of the various controllers 44 and their associated components.

As shown in FIG. 2, the traction battery 16 may have a positive terminal 50 and a negative terminal 52 connected to conductors 18, 20 of DC bus 22. Electrical isolation between the traction battery terminals 50, 52 and a chassis ground (i.e., the vehicle frame/chassis) 54 may be maintained according to a minimum value for electrical isolation in a high-voltage system as required by government regulations and/or industry standards, such as an electrical isolation of no less than 500 ohms/Volt between the battery terminals 50, 52 and the chassis ground 54. The chassis ground 54 is defined as a common reference point to which electrical devices of the DC power circuit 12 are electrically connected to. The electrical isolation may be described as a leakage resistance between the chassis ground 54 and a terminal 50, 52 of the traction battery 16. Under normal conditions, a leakage resistance (that may occur at various locations within the DC power circuit 12) will have a relatively large value and little or no leakage current will flow through the chassis ground 54. However, under fault conditions, the leakage resistance can decrease such that larger levels of leakage current flow through the chassis ground 54.

According to embodiments of the invention, a plurality of DC leakage current detectors 58 are placed throughout the DC power circuit 12 of vehicle 10 for detecting the presence of electrical isolation issues. The DC leakage current detectors 58 function to detect leakage current to the vehicle frame 54 that arises from a fault anywhere in the DC power circuit 12, and further function to locate the low leakage current fault—with operation of the DC leakage current detectors 58 enabling a determination of the path of the leakage current within the DC power circuit 12. More specifically, a DC leakage current detector 58 is positioned on each of a number of independent branches 60 of the DC bus 22 of DC power circuit 12, with each branch 60 including thereon a component of the DC power circuit 12 (e.g., battery pack 16, electrical machine 14, DC-AC inverter 24, DC-DC converter 26, battery charger 34, export inverter 36, etc.). In such a manner, each of the independent branches 60 of the DC bus 22 can be separately monitored to detect a leakage current therein.

An exemplary placement of the DC leakage current detectors 58 in/on the DC power circuit 12 is shown in FIG. 2, with each of the detectors 58 being indicated as being positioned around pairs of conductors 18, 20 of its respective branch 60 of the DC bus 22. The path of the leakage current is then determined by observing which DC leakage current detectors 58 detect the leakage current and which DC leakage current detectors 58 do not. The DC leakage current detectors 58 are connected to a logic device 62 that, according to embodiments of the invention, may be incorporated into system controller 46 or may be provided as a separate controller or logic device, with outputs of the DC leakage current detectors 58 being provided to the logic device 62 to determine the fault location. That is, the logic device 62 functions to determine the fault location based on which particular DC leakage current detectors 58 indicate a fault. As one example, a fault at the terminals 50, 52 of the battery charger 16 will cause leakage current to flow from the battery pack 16 to the battery charger 34, such that the DC leakage current detector 58 at the terminals of the battery pack 16 and the DC leakage current detector 58 at the battery charger 34 will detect the fault, while DC leakage current detectors 58 at the terminals of the export inverter 36 and at the propulsion motor 14 will not detect the fault—therefore causing the logic device 62 to determine that the fault is located on a path between the battery pack 16 and the battery charger 34.

Figure 3:
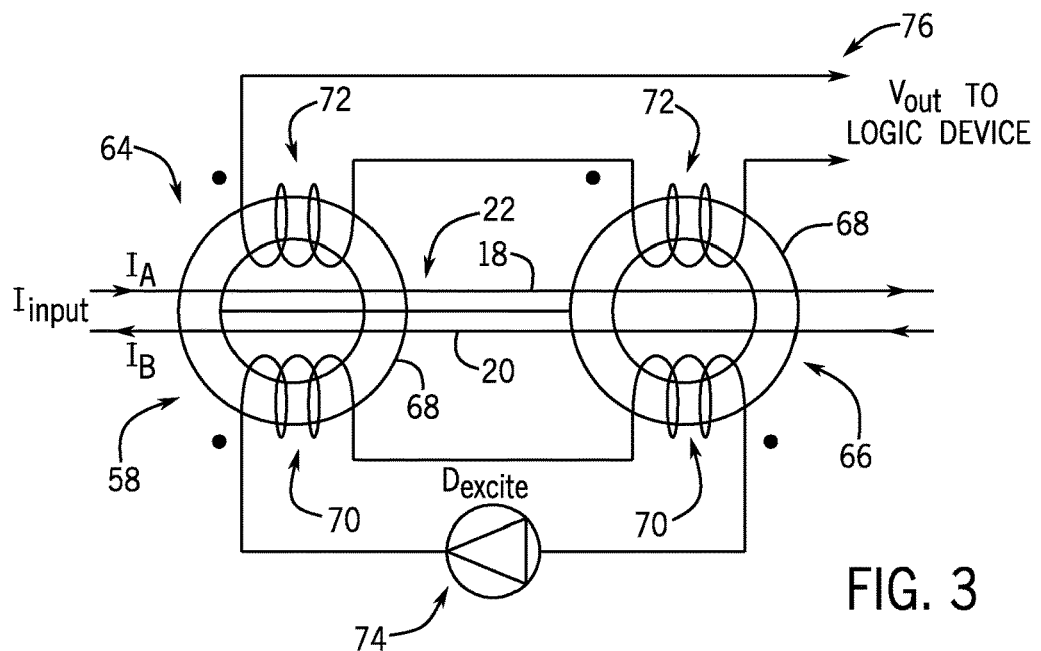
FIG. 3 is a schematic diagram of a DC leakage current detector with unsaturated transformers, according to an embodiment of the invention.
Figure 5:
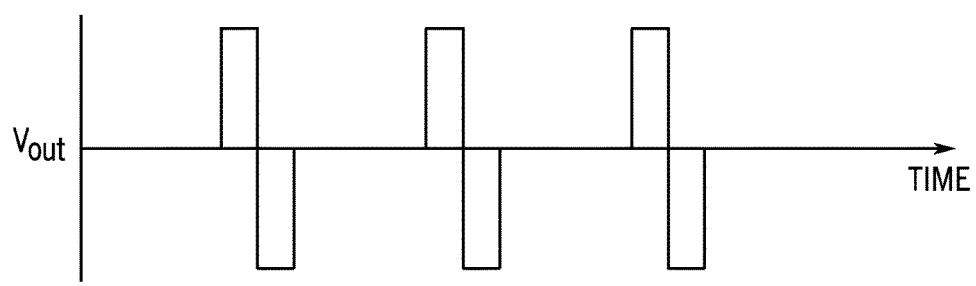
FIG. 5 is a graph illustrating a net voltage output waveform produced by the DC leakage current detector of FIG. 3 responsive to a leakage current in the DC power circuit along the measured branch thereof, according to an embodiment of the invention.
Figure 6:
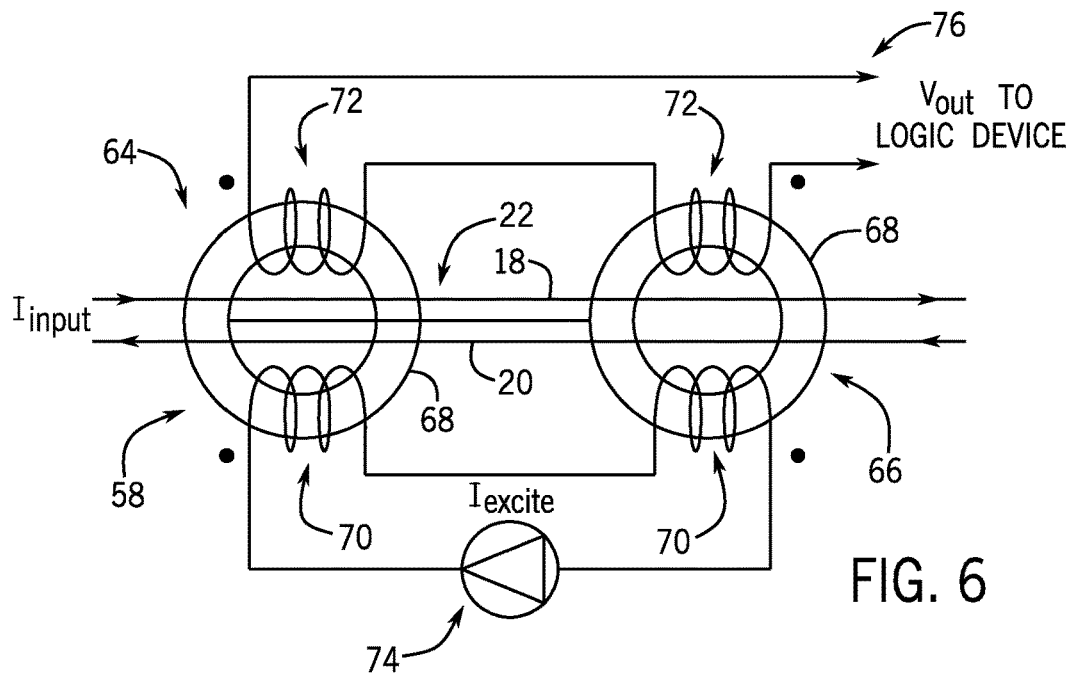
FIG. 6 is a schematic diagram of a DC leakage current detector with saturated transformers, according to an embodiment of the invention.

In general, any sort of sensor that can detect DC leakage current can be used as the DC leakage current detectors 58. However, according to an exemplary embodiment of the invention, the DC leakage current detector 58 is comprised of a pair of transformers, as will be described in greater detail hereafter with respect to FIGS. 3-8, which are directed to a construction of the transformers and operation thereof in detecting DC leakage current. As shown in FIGS. 3 and 6, each DC leakage current detector 58 includes a pair of transformers 64, 66 each formed of a magnetic core 68 and a pair of windings 70, 72, with each of the cores 68 having identical magnetizing characteristics (i.e., B and H field relationships). The cores 68 are constructed such that the conductors 18, 20 of the DC bus 22 pass through an opening formed in the core. Because the main power conductors 18, 20 are usually large gauge wires, and in order to simplify the construction of the power circuits, the main power conductors 18, 20 pass through the cores 68 a small number of times, ideally just once. The pair of windings 70, 72 wound about each core 68 include an excitation winding 70 and a detection winding 72, with the polarities of the windings being indicated in FIGS. 3 and 6 with the usual convention using dots. An excitation/biasing circuit 74 is electrically coupled to the excitation winding 70 of each transformer 64, 66 to selectively inject a current signal thereto, while an output 76 of the detection winding 72 of each transformer 64, 66—i.e., an output 76 of the detector 58—is operably connected to the logic circuit 62 to provide output signals.

Figure 4:
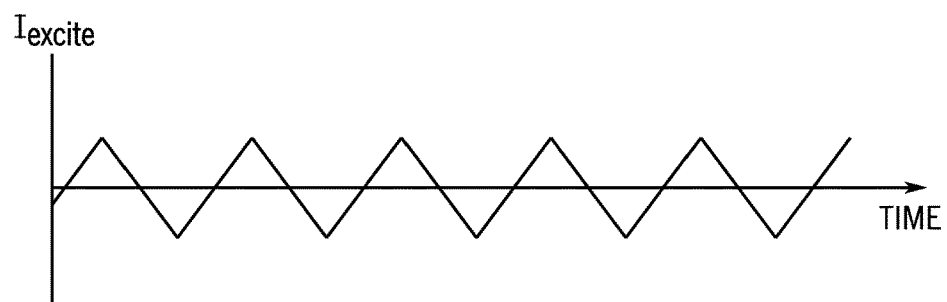
FIG. 4 is a graph illustrating a sawtooth excitation current waveform injected into an excitation windings of the DC leakage current detector of FIG. 3, according to an embodiment of the invention.

According to one embodiment of the invention, and as shown in FIG. 3, the DC leakage current detector 58 detects a leakage current fault by being constructed as and operating its transformers 64, 66 as unsaturated transformers. In operation of the DC leakage current detector 58, the detector is positioned such that the conductors 18, 20 of the DC power system 12 pass through an opening in each of the cores 68 of the transformers, creating a magnetic field that is the sum of the currents. The magnetic field is detected by injecting a small amount of current onto the excitation windings 70 of the transformers 64, 66 via the excitation/biasing circuit 74. A typical excitation current injected by excitation/biasing circuit 74 is shown in FIG. 4 as a sawtooth waveform, but it is recognized that other waveform shapes are possible as well. The function of the excitation current is to create a changing magnetic flux within the cores 68 that slightly saturates the cores.

Upon injection of a current signal into the excitation winding 70 on each of the transformers 64, 66, a voltage is monitored on the detection winding 72 on each of the transformers 64, 66—with the presence or absence of a voltage on the detection windings 72 indicating whether a leakage current is present on the conductors 18, 20 at the monitored location at which the DC leakage current detector 58 is positioned. That is, as long as there is no leakage current through the conductors 18, 20, the flux excursions in each of the cores 68 are equal and opposite. As a result, the voltages generated in each of the detection windings 72 are equal and opposite, and the net voltage at output 76 of the DC leakage current detector 58 is zero. However, the presence of leakage current on the conductors 18, 20 causes the symmetry between the flux waveforms in the two cores 68 to be broken. As a result, there will be brief periods when one core 68 is saturated and the other is not, which will produce a net voltage waveform on the detection windings 72 that is then output from the DC leakage current detector 58 at output 76. An example of such a net voltage waveform at output 76 that is indicative of a leakage current on the conductors 18, 20 is shown in FIG. 5.

Figure 7:
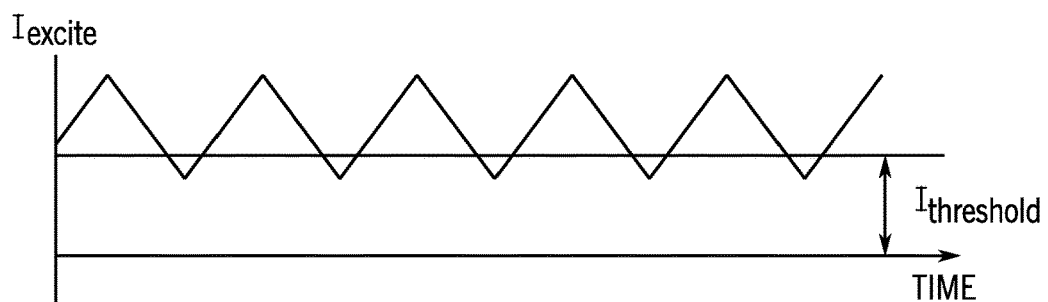
FIG. 7 is a graph illustrating a sawtooth excitation current waveform injected into an excitation windings of the DC leakage current detector of FIG. 6, according to an embodiment of the invention.
Figure 8:
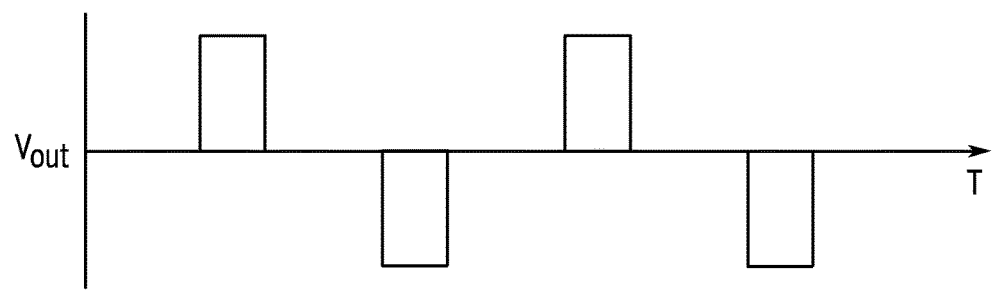
FIG. 8 is a graph illustrating a net voltage output waveform produced by the DC leakage current detector of FIG. 6 responsive to a leakage current in the DC power circuit along the measured branch thereof, according to an embodiment of the invention.

According to another embodiment of the invention, and as shown in FIG. 6, the DC leakage current detector 58 detects a leakage current fault by being constructed as and operating its transformers 64, 66 as saturated transformers. Thus as compared to the unsaturated transformers of FIG. 3, the polarity of one of the windings 70, 72 in the DC leakage current detector 58 is reversed, as can be seen in FIG. 6, and both cores 68 are normally saturated. In operation of the DC leakage current detector 58, the detector is positioned such that the conductors 18, 20 of the DC power system 12 pass through an opening in each of the cores 68 of the transformers 64, 66, creating a magnetic field that is the sum of the currents. The magnetic field is detected by injecting a small amount of current into the excitation windings 70 of the transformers 64, 66 via the excitation/biasing circuit 74, with the injected current signals including a DC bias that maintains the transformer cores 68 in saturation. A sawtooth waveform excitation current that includes a DC bias is shown in FIG. 7 according to one embodiment.

Upon injection of a current signal into the excitation winding 70 on each of the transformers 64, 66, a voltage is monitored on the detection winding 72 of each of the transformers 64, 66—with the presence or absence of a voltage on the detection windings 72 indicating whether a leakage current is present on the conductors 18, 20 at the monitored location at which the DC leakage current detector 58 is positioned. In the unsaturated transformer embodiment of FIG. 6, the presence of leakage current counteracts the bias in one of the transformers 64, 66, taking it out of saturation, which will cause a voltage to appear on the detection windings 72 on that transformer 64, 66, while under unfaulted conditions there will be no signal. A net voltage waveform on the detection winding 72 of the transformer 64, 66 taken out of saturation is then provided to output 76 of the DC leakage current detector 58 and sent to logic device 62, with an example of such a net voltage waveform indicative of a leakage current on the conductors 18, 20 being shown in FIG. 8.

With respect to the injection current signals generated by excitation/biasing circuit 74 that maintain the transformer cores 68 in saturation, it is recognized that since the amount of leakage current is determined by the sizes of the resistors 55, 56 in the DC power circuit 12 in FIG. 2 that are used to maintain a voltage difference between the vehicle frame 54 and the power circuit, the amount of fault current is known ahead of time, and the excitation/biasing circuit 74 can be designed such that the leakage current approximately counteracts the DC bias in one of the cores 68.

Thus, with regard to the saturated and unsaturated transformer constructions/operations shown and described in FIGS. 3-8, it can thus be seen that the embodiments operate on alternating principles with regard to the detection of a leakage current in the conductors 18, 20. Another difference between the embodiments of FIGS. 3 and 6 is that the number of turns for each of the excitation windings 70 does not have to be the same for each core 68 for the saturated transformers 64, 66. In fact, depending on the size of the resistors 55, 56 in FIG. 2, the number of turns for each of the excitation windings 70 would be deliberately different, sized to reflect the difference in the amount of leakage current that flows for a fault from the positive or the negative side of the DC power circuit 12 to the frame 54.

Figure 9:
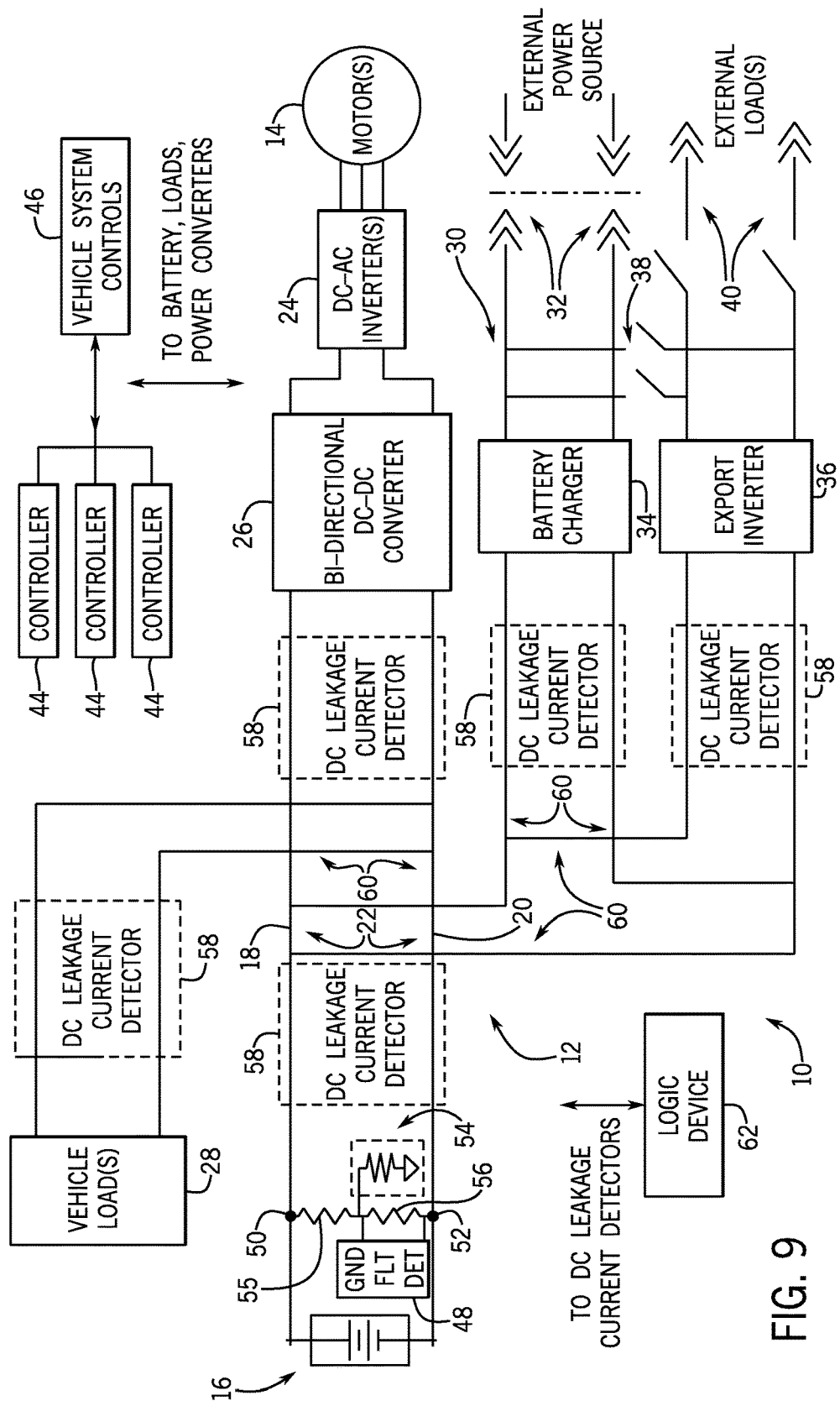
FIGS. 9 and 10 are schematic diagrams of DC power circuits in an electric vehicle with a plurality of DC leakage current detectors positioned throughout the circuit, along with additional ground fault detection circuitry, according to embodiments of the invention.
Figure 10:
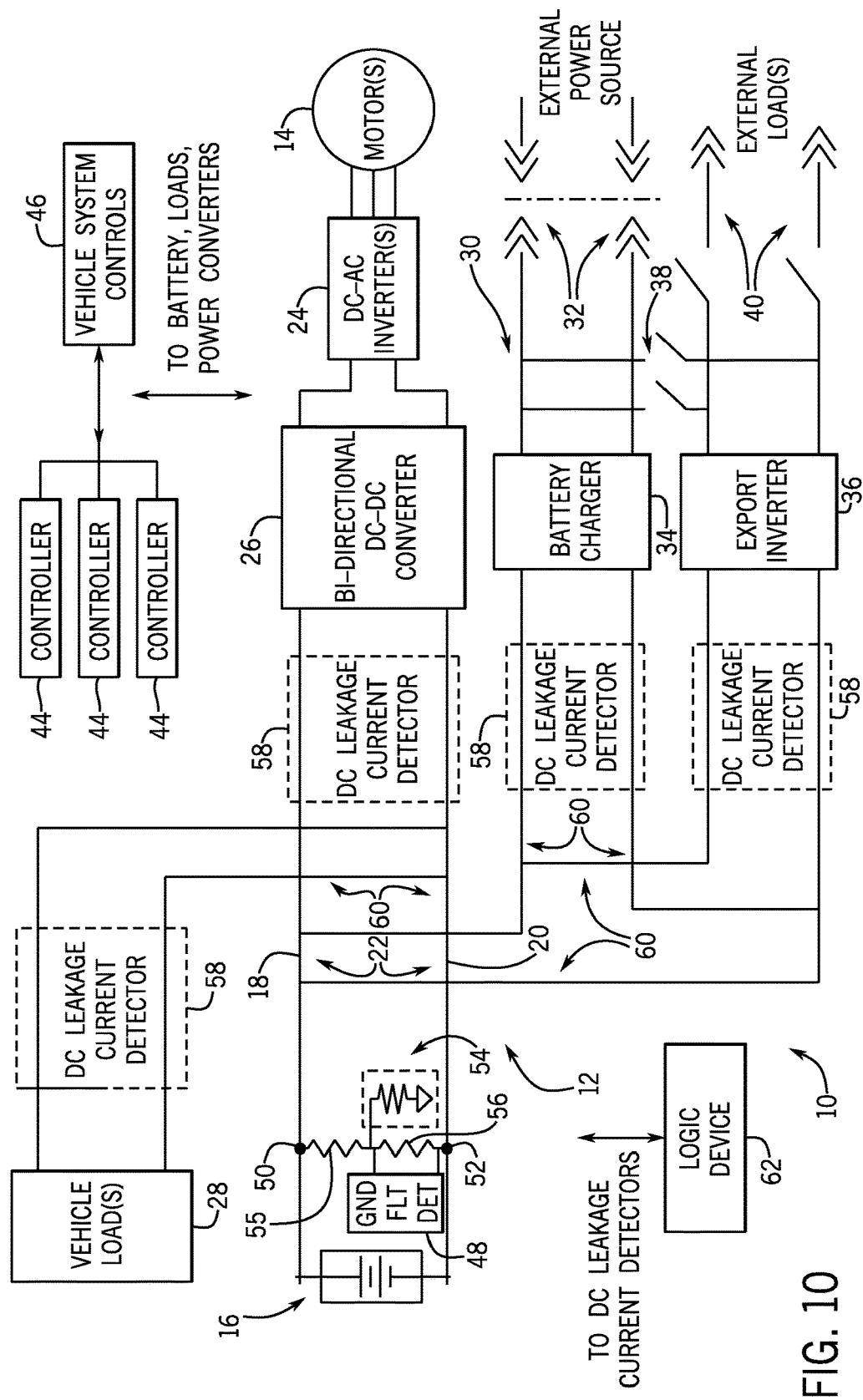

Referring back now to FIG. 2, while the embodiment therein is shown as including a stand-alone DC leakage current detector 58 on each of the independent branches 60 of the DC distribution bus 22 that collectively operate to identify and locate leakage current faults in the DC power circuit without the use of other/additional fault detection circuitry, it is recognized that other embodiments of the invention may include additional ground fault detection circuitry 48. That is, other known ground fault detection circuitry 48 may be used in combination with DC leakage current detectors 58 to monitor the level of leakage current flowing through the chassis ground 54. Examples of such known ground fault detection circuitry 48 that might be used in combination with DC leakage current detectors 58 is shown in FIGS. 9 and 10. As shown therein, the ground fault detection circuitry 48 may be connected to each terminal 50, 52 of the traction battery 16 and to the DC bus 22 and functions to detect a voltage change in/across a pair of resistors 55, 56 that is indicative of a leakage current in the DC power circuit 12. The actual voltage during a fault depends on the ratio of the resistance of the fault leakage path to the resistance of the two biasing resistors 55, 56, with it being recognized that the ratio of the resistance of the usual causes of leakage current to the biasing resistance is low enough to produce a significant change in voltage during a fault. Accordingly, a change in voltage across the either of resistors 55, 56 is easily detected by ground fault detection circuitry 48 to identify the presence of ground fault leakage current to the vehicle frame 54.

In the embodiment of FIG. 9, ground fault detection circuitry 48 is provided for identifying leakage current faults in the DC power circuit 12 and DC leakage current detectors 58 are provided on each of the independent branches 60—including the branch 60 connected to the terminals 50, 52 of the battery charger 16. The DC leakage current detectors 58 may be operated as described above with respect to FIGS. 2-8 to detect the leakage current and locate the fault, with the ground fault detection circuitry 48 providing some redundancy in leakage current fault detection when operated along with the DC leakage current detectors 58 to increase reliability of leakage current fault detection in the DC power circuit 12. In the alternative embodiment shown in FIG. 10, the branch 60 connected to the terminals 50, 52 of the battery charger 16 does not include a DC leakage current detector 58 thereon. In such an embodiment, the location of a leakage fault may still be identified either by the other DC leakage current detectors 58 or, if none of the DC leakage current detectors 58 detects a fault but a fault is detected by the ground fault detection circuitry 48, then it is known that the leakage fault is located on the branch without a DC leakage current detector 58 thereon.

Beneficially, embodiments of the invention thus provide a system and method for leakage current detection and fault location identification in a DC power circuit in hybrid and electric vehicles. A plurality of DC leakage current detectors are positioned throughout the DC power circuit, with the DC leakage current detectors functioning to determine the path of any leakage current in the DC power circuit.

According to one embodiment of the invention, a system includes a DC power circuit having a DC bus comprising a pair of conductors, one or more energy storage devices connected to the DC bus to provide a DC power thereto, one or more power converters connected to the DC bus and configured to condition the DC power, and one or more loads positioned to receive power from the DC bus or the one of the respective one or more power converters. The system also includes a plurality of DC leakage current detectors positioned throughout the DC power circuit, the plurality of DC leakage current detector configured to sense and locate a leakage current fault in the DC power circuit, and wherein each of the plurality of DC leakage current detectors is configured to generate a net voltage at an output thereof indicative of whether a leakage current fault is present at a location at which the respective DC leakage current detector is positioned.

In accordance with another embodiment of the invention, a method of sensing and locating a leakage current fault in a DC power circuit comprising a plurality of independent branches is disclosed. The method includes positioning a plurality of DC leakage current detectors throughout the DC power circuit on at least a portion of the independent branches. The method also includes generating, at each of the plurality of DC leakage current detectors, a net voltage output indicative of whether a leakage current fault is present at a location at which the respective DC leakage current detector is positioned and transmitting an output signal from each of the plurality of DC leakage current detectors to a logic device operably connected to the plurality of DC leakage current detectors, the output signal from each respective DC leakage current detector being representative of the net voltage output thereof. The method further includes analyzing, via the logic device, the output signals transmitted from the plurality of DC leakage current detectors to identify a location of a leakage current fault in the DC power circuit.

In accordance with yet another embodiment of the invention, a vehicle includes a chassis and a DC power circuit electrically isolated from the chassis, the DC power circuit including a DC distribution bus comprising a plurality of independent branches and a plurality of system components electrically coupled to the DC distribution bus, the plurality of system components including one or more of each of energy storage devices, power converters, and vehicle loads. The vehicle also includes a plurality of DC leakage current detectors positioned throughout the DC power circuit on the plurality of independent branches, the plurality of DC leakage current detector configured to sense a leakage current fault in the DC power circuit. The vehicle further includes a logic device in operable communication with the plurality of DC leakage current detectors, the logic device being programmed to receive output signals from each of the plurality of DC leakage current detectors, the output signals comprising net voltage output data from each respective DC leakage current detector indicative of whether a leakage current fault is present at a location at which the respective DC leakage current detector is positioned. The logic device is further programmed to locate the leakage current fault in the DC power circuit based on the output signals received from the plurality of DC leakage current detectors.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A system comprising:
   a DC power circuit including:
      a DC bus comprising a pair of conductors;
      one or more energy storage devices connected to the DC bus to provide a DC power thereto;
      one or more power converters connected to the DC bus and configured to condition the DC power; and
      one or more loads positioned to receive power from the DC bus or the one of the respective one or more power converters; and
   a plurality of DC leakage current detectors positioned throughout the DC power circuit, the plurality of DC leakage current detectors configured to sense and locate a leakage current fault in the DC power circuit;
   wherein each of the plurality of DC leakage current detectors is configured to generate a net voltage at an output thereof indicative of whether a leakage current fault is present at a location at which the respective DC leakage current detector is positioned.

2. The system of claim 1 further comprising a logic device operably coupled to the plurality of DC leakage current detectors, the logic device configured to:
   receive an output signal from each of the plurality of DC leakage current detectors, the output signal being representative of the net voltage at the output of the respective DC leakage current detector; and
   locate the leakage current fault in the DC power circuit based on the output signals received from the plurality of DC leakage current detectors;
   wherein a pattern of the output signals, and their being indicative of the leakage current fault being present at the location at which the respective DC leakage current detector is positioned, being analyzed to locate the leakage current fault in the DC power circuit.

3. The system of claim 1 wherein the DC bus comprises a plurality of independent branches, with each independent branch including thereon a respective one of the energy storage devices, power converters, or loads thereon.

4. The system claim 3 wherein a respective DC leakage current detector of the plurality of DC leakage current detectors is positioned on each of the plurality of independent branches.

5. The system of claim 3 further comprising ground fault detection circuitry and associated resistors configured to detect leakage current on an independent branch of the DC bus.

6. The system of claim 5 wherein the ground fault detection circuitry and associated resistors are positioned on one independent branch of the DC bus and the plurality of DC leakage current detectors are positioned on remaining independent branches of the DC bus.

7. The system of claim 5 wherein the ground fault detection circuitry and associated resistors are positioned on one independent branch of the DC bus and a respective DC leakage current detector of the plurality of DC leakage current detectors is positioned on each of the plurality of independent branches, including the independent branch with the ground fault detection circuitry and associated resistors.

8. The system of claim 1 wherein each of the plurality of DC leakage current detectors comprises:
   a pair of transformers, each of the pair of transformers including:
      a magnetic core positioned about the pair of conductors of the DC bus; and
      a pair of windings wound about the magnetic core, the pair of windings including an excitation winding and a detection winding;
   a biasing circuit connected to the excitation winding in each of the pair of transformers to inject a current signal thereto; and
   a detector output connected to the detection winding in each of the pair of transformers to receive a voltage therefrom, such that the net voltage is present at the detector output.

9. The system of claim 8 wherein the pair of transformers comprise unsaturated transformers, with the injected current signal creating a changing magnetic flux that slightly saturates the magnetic cores of the transformers; and
   wherein, when leakage current is present in the conductors at the location of the respective DC leakage current detector, a symmetry between magnetic flux waveforms in the magnetic cores of the transformers is broken, such that the magnetic core of one transformer is saturated and the magnetic core of the other transformer is unsaturated, such that the net voltage at the detector output has a non-zero value.

10. The system of claim 8 wherein the pair of transformers comprise saturated transformers, with the injected current signal including a DC bias that maintains the magnetic cores of the transformers in saturation; and
    wherein, when leakage current is present in the conductors at the location of the respective DC leakage current detector, the magnetic core of one transformer is taken out of saturation and the magnetic core of the other transformer remains in saturation, such that the net voltage at the detector output has a non-zero value.

11. The system of claim 1 wherein the DC power circuit is included on an electric or hybrid vehicle, and wherein the DC power circuit is electrically isolated from a vehicle chassis of the electric or hybrid vehicle.

12. A method of sensing and locating a leakage current fault in a DC power circuit comprising a plurality of independent branches, the method comprising:
    positioning a plurality of DC leakage current detectors throughout the DC power circuit on at least a portion of the independent branches;
    generating, at each of the plurality of DC leakage current detectors, a net voltage output indicative of whether a leakage current fault is present at a location at which the respective DC leakage current detector is positioned;
    transmitting an output signal from each of the plurality of DC leakage current detectors to a logic device operably connected to the plurality of DC leakage current detectors, the output signal from each respective DC leakage current detector being representative of the net voltage output thereof; and
    analyzing, via the logic device, the output signals transmitted from the plurality of DC leakage current detectors to identify a location of a leakage current fault in the DC power circuit.

13. The method of claim 12 wherein positioning the plurality of DC leakage current detectors comprises positioning a DC leakage current detector on each of the plurality of independent branches.

14. The method of claim 12 further comprising positioning ground fault detection circuitry and associated resistors on one independent branch of the DC bus.

15. The method of claim 14 wherein positioning the plurality of DC leakage current detectors comprises one of:
   positioning a DC leakage current detector on each of the plurality of independent branches except for the one independent branch on which the ground fault detection circuitry and the associated resistors are positioned; or
   positioning a DC leakage current detector on each of the plurality of independent branches, such that the ground fault detection circuitry and associated resistors and a DC leakage current detector are redundantly positioned on the one independent branch.

16. A vehicle comprising:
   a chassis;
   a DC power circuit electrically isolated from the chassis, the DC power circuit comprising:
      a DC distribution bus comprising a plurality of independent branches; and
      a plurality of system components electrically coupled to the DC distribution bus, the plurality of system components including one or more of each of energy storage devices, power converters, and vehicle loads;
   a plurality of DC leakage current detectors positioned throughout the DC power circuit on the plurality of independent branches, the plurality of DC leakage current detector configured to sense a leakage current fault in the DC power circuit; and
   a logic device in operable communication with the plurality of DC leakage current detectors, the logic device being programmed to:
      receive output signals from each of the plurality of DC leakage current detectors, the output signals comprising net voltage output data from each respective DC leakage current detector indicative of whether a leakage current fault is present at a location at which the respective DC leakage current detector is positioned; and
      locate the leakage current fault in the DC power circuit based on the output signals received from the plurality of DC leakage current detectors.

17. The vehicle of claim 16 wherein, in locating the leakage current fault in the DC power circuit, the logic device is programmed to assess a pattern of the output signals, and their being indicative of the leakage current fault being present at the location at which the respective DC leakage current detector is positioned, to determine a path of the leakage current fault in the DC power circuit.

18. The vehicle of claim 16 further comprising ground fault detection circuitry and associated resistors configured to detect leakage current on one independent branch of the DC bus, the ground fault detection circuitry replacing a respective DC leakage current detector on the one independent branch or being used in combination with a respective DC leakage current detector on the one independent branch.

19. The vehicle of claim 16 wherein each of the plurality of DC leakage current detectors comprises:
   a pair of transformers, each of the pair of transformers including:
      a magnetic core positioned about the pair of conductors of the DC bus; and
      a pair of windings wound about the magnetic core, the pair of windings including an excitation winding and a detection winding;
   a biasing circuit connected to the excitation winding in each of the pair of transformers to inject a current signal thereto; and
   a detector output connected to the detection winding in each of the pair of transformers to receive a voltage therefrom, such that the net voltage is present at the detector output.

20. The vehicle of claim 16 wherein the plurality of system components comprises at least one of a battery pack, a propulsion motor, vehicle loads, a DC-AC inverter for providing AC power to the propulsion motor, a battery charger for charging the battery pack, and an export inverter to output AC power from the vehicle to an external load.

* * * * *